(12) United States Patent
Liu

(10) Patent No.: US 11,943,949 B2
(45) Date of Patent: Mar. 26, 2024

(54) DISPLAY PANEL INCLUDING LIGHT-EMITTING UNITS IN THROUGH-HOLES OF A RETAINING WALL STRUCTURE, AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Shiqi Liu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/753,840

(22) PCT Filed: Jan. 16, 2020

(86) PCT No.: PCT/CN2020/072392
§ 371 (c)(1),
(2) Date: Apr. 6, 2020

(87) PCT Pub. No.: WO2021/138929
PCT Pub. Date: Jul. 15, 2021

(65) Prior Publication Data
US 2022/0344613 A1    Oct. 27, 2022

(30) Foreign Application Priority Data

Jan. 7, 2020 (CN) .......................... 202010012372.1

(51) Int. Cl.
*H10K 50/813* (2023.01)
*H10K 50/86* (2023.01)
(Continued)

(52) U.S. Cl.
CPC ......... *H10K 50/813* (2023.02); *H10K 50/865* (2023.02); *H10K 71/00* (2023.02); *H10K 2102/102* (2023.02); *H10K 2102/103* (2023.02)

(58) Field of Classification Search
None
See application file for complete search history.

(56) References Cited

U.S. PATENT DOCUMENTS

2005/0247936 A1    11/2005    Bae et al.
2006/0145602 A1    7/2006    Yoo
(Continued)

FOREIGN PATENT DOCUMENTS

| CN | 1584669 A | 2/2005 |
|---|---|---|
| CN | 1697578 A | 11/2005 |

(Continued)

*Primary Examiner* — Kirk W Hermann
(74) *Attorney, Agent, or Firm* — PV IP PC; Wei Te Chung; Zhigang Ma

(57) ABSTRACT

A display panel includes a first substrate including a first leading line, a second substrate including a cover plate, a first electrode disposed on the cover plate in a direction of the first substrate and extending from a non-light-emitting region to light-emitting region, and a second leading line disposed on the first electrode.

4 Claims, 5 Drawing Sheets

(51) Int. Cl.
  *H10K 71/00*    (2023.01)
  *H10K 102/10*   (2023.01)

(56)           References Cited

U.S. PATENT DOCUMENTS

2010/0136722 A1    6/2010  Kim et al.
2012/0313099 A1*  12/2012  Chung ................. H10K 59/131
                                                            438/34
2016/0118420 A1*   4/2016  Yang .................. H01L 27/1255
                                                            257/40
2016/0133681 A1*   5/2016  Nam .................. H01L 27/3258
                                                            257/40
2019/0172954 A1*   6/2019  Zhou ....................... H01L 29/24
2019/0181188 A1*   6/2019  Youn .................. H01L 27/3262
2020/0168144 A1*   5/2020  Luan .................... G09G 3/2003
2020/0194719 A1*   6/2020  Choi .................. H01L 51/0097
2020/0227509 A1*   7/2020  Yoon ....................... H10K 71/00
2020/0273929 A1*   8/2020  Kim ....................... H10K 59/38
2020/0328375 A1*  10/2020  Won ....................... H10K 71/00

FOREIGN PATENT DOCUMENTS

CN          1761371  A       4/2006
CN          1805635  A   *   7/2006   ......... H01L 27/3246
CN          1805635  A       7/2006
CN        107680993  A   *   2/2018   ............ H01L 21/77
CN        110286803  A       9/2019
WO       2012121375  A1      9/2012

\* cited by examiner

Forming a third insulating layer on the second insulating layer, wherein the third insulating layer covers the second metal layer, a through-hole is formed on the third insulating layer, and the through-hole in the non-light-emitting region corresponds to the second metal layer in the non-light-emitting region.

Preparing a layer of conductive materials in the through-hole in the non-light-emitting region, and patterning to form the first leading line.

FIG. 6

DISPLAY PANEL INCLUDING LIGHT-EMITTING UNITS IN THROUGH-HOLES OF A RETAINING WALL STRUCTURE, AND MANUFACTURING METHOD THEREOF

FIELD OF INVENTION

The present disclosure relates to the field of display technology, and more particularly, to a display panel and a manufacturing method thereof.

BACKGROUND OF INVENTION

Active-matrix organic light-emitting diode (AMOLED) is a display panel technology. Wherein, organic light-emitting diode (OLED) is a specific type of thin film display technology known as organic electroluminescence display, and active matrix (AM) refers to a pixel addressing technology.

With high demand for display quality of panels, AMOLED displays have gradually occupied the high-end display market due to their color gamut and contrast advantages, but they still have room for improvement. At present, most OLEDs are formed by evaporation. In recent years, preparation of printed OLEDs has gradually emerged, and due to its advantage of high material utilization, it has become a main development direction of future AMOLED displays.

SUMMARY OF INVENTION

In order to solve the above technical problems, the present disclosure provides a display panel and a manufacturing method thereof, which are used to solve the technical problems that affect planarization of anodes due to excessive lines on an array substrate in the prior art.

A technical solution to solve the above technical problems is that the present disclosure provides a display panel comprising a light-emitting region and a non-light-emitting region surrounding the light-emitting region; a first substrate, wherein a first leading line disposed on one side of the first substrate; a second substrate connected to the side of the first substrate comprising the leading line, wherein the second substrate comprises a cover plate; a first electrode disposed on one side of the cover plate in a direction of the first substrate, and extending from the non-light-emitting region to the light-emitting region; a retaining wall structure disposed on the first electrode, wherein the retaining wall structure comprises a plurality of through-holes and a plurality of retaining walls surrounding the through-holes, and the retaining walls are disposed in the non-light-emitting region; a light-emitting layer comprising a plurality of light-emitting units, wherein any one of the light-emitting units is correspondingly disposed in the through-holes of the retaining wall structure; a second electrode extending from the non-light-emitting region to one side of the light-emitting layer away from the cover plate; a packaging layer disposed on the first electrode and covering the retaining wall structure, the light-emitting layer, and the second electrode; and a second leading line disposed on the first electrode of the non-light-emitting region, wherein the second leading line penetrates through the retaining wall structure and the packaging layer.

Furthermore, the second electrode extends from a surface of the corresponding light-emitting unit to the retaining wall structure of the non-light-emitting region, and an interval is defined between the second electrode and the second leading line which are disposed on the retaining wall structure.

Furthermore, the first leading line corresponds to the second leading line disposed in the non-light-emitting region.

Furthermore, the first substrate comprises a base substrate; a light-shielding metal layer disposed in the non-light-emitting region on the base substrate; a buffer layer disposed on the second substrate and covering the light-shielding metal layer; an active layer disposed on the buffer layer; a first insulating layer disposed on the active layer, wherein an orthographic projection of the first insulating layer on the base substrate completely falls within an orthographic projection of the active layer on the base substrate; a first metal layer disposed on the first insulating layer; and a second insulating layer disposed on the buffer layer and covering the active layer, the first insulating layer, and the first metal layer.

Furthermore, the active layer comprises a first active layer disposed in the non-light-emitting region and corresponding to the light-shielding metal layer; a second active layer disposed in the light-emitting region; and a second metal layer disposed on the second insulating layer and comprising a first metal segment disposed in the non-light-emitting and corresponding to the first active layer, wherein the first metal segment comprises at least two pins, one of the pins penetrates through the second insulating layer to connect to the first active layer, and the other pin penetrates through the second insulating layer and the buffer layer to connect to the light-shielding metal layer.

Furthermore, the display panel comprises a third insulating layer disposed on the second insulating layer and covering the second metal layer, a via hole is defined in the third insulating layer corresponding to the first metal segment, and the first leading line is disposed on an inner surface of the via hole and covers a region where the first metal segment is exposed from the via hole.

Furthermore, a material of the first leading line comprises at least one of indium zinc oxide, indium tin oxide, aluminum, or silver.

The present disclosure further provides a manufacturing method of a display panel, the display panel comprising a light-emitting region and a non-light-emitting region surrounding the light-emitting region, wherein the manufacturing method comprises a method of forming a first substrate and a method of forming a second substrate. The method of forming the second substrate comprises: providing a cover plate; forming a first electrode on the cover plate; forming a retaining wall structure on the first electrode in the non-light-emitting region, and defining a through-hole in the light-emitting region corresponding to the retaining wall structure; forming a light-emitting layer in the through-hole of the retaining wall structure, wherein the light-emitting layer comprises light-emitting units comprising at least two colors, and the colors of adjacent light-emitting units are different; forming a second electrode on the light-emitting units, wherein the second electrode extends from a corresponding surface of the light-emitting units to a portion of the retaining wall structure adjacent to second electrode; forming a penetrating hole in the retaining wall structure of the non-light-emitting region, wherein an interval is defined between the penetrating hole in the non-light-emitting region and the second electrode of the non-light-emitting region; filling a conductive material in the penetrating hole to form a second leading line; forming a packaging layer above the first electrode, wherein the packaging layer covers the retaining wall structure, the light-emitting layer, and the second electrode, and a portion of the second leading line is exposed outside of the packaging layer; forming a first leading line on the first substrate corresponding to the second leading line; and combining the first substrate and the second substrate, wherein the second leading line is correspondingly connected to the first leading line.

Furthermore, the method of forming the second substrate comprises: providing a base substrate; preparing a shielding metal material on the base substrate, and patterning the shielding metal material to form a light-shielding metal layer; forming a buffer layer disposed on the base substrate and covering the light-shielding metal layer; forming a layer of indium gallium zinc oxide (IGZO), and patterning the layer of IGZO to form an active layer, wherein the active layer comprises a first active layer above the light-shielding metal layer in the non-light-emitting region and comprises a second active layer disposed in the light-emitting region; forming a first insulating layer on the active layer; forming a first metal layer on the first insulating layer; forming a second insulating layer on the buffer layer, wherein the second insulating layer covers the active layer, the first insulating layer, and first metal layer; and forming a second metal layer on the second insulating layer, wherein the second metal layer disposed in the non-light-emitting region is connected to the first active layer and the light-shielding metal layer through connecting holes in the non-light-emitting region, and the second metal layer disposed in the light-emitting region is connected to the second active layer through connecting holes in the light-emitting region.

Furthermore, the method of forming the second substrate further comprises forming a third insulating layer on the second insulating layer, wherein the third insulating layer covers the second metal layer, a via hole is formed in the third insulating layer, and the via hole is in the non-light-emitting and located corresponding to the second metal layer in the non-light-emitting region; and preparing a layer of conductive materials in the via hole in the non-light-emitting region, and patterning the layer of the conductive materials to form the first leading line.

DESCRIPTION OF DRAWINGS

The following detailed description of specific embodiments of the present disclosure will make technical solutions and other beneficial effects of the present disclosure obvious in conjunction with the accompanying drawings.

FIG. 6 is a schematic flowchart showing a manufacturing method of a second substrate.

Figure 1:
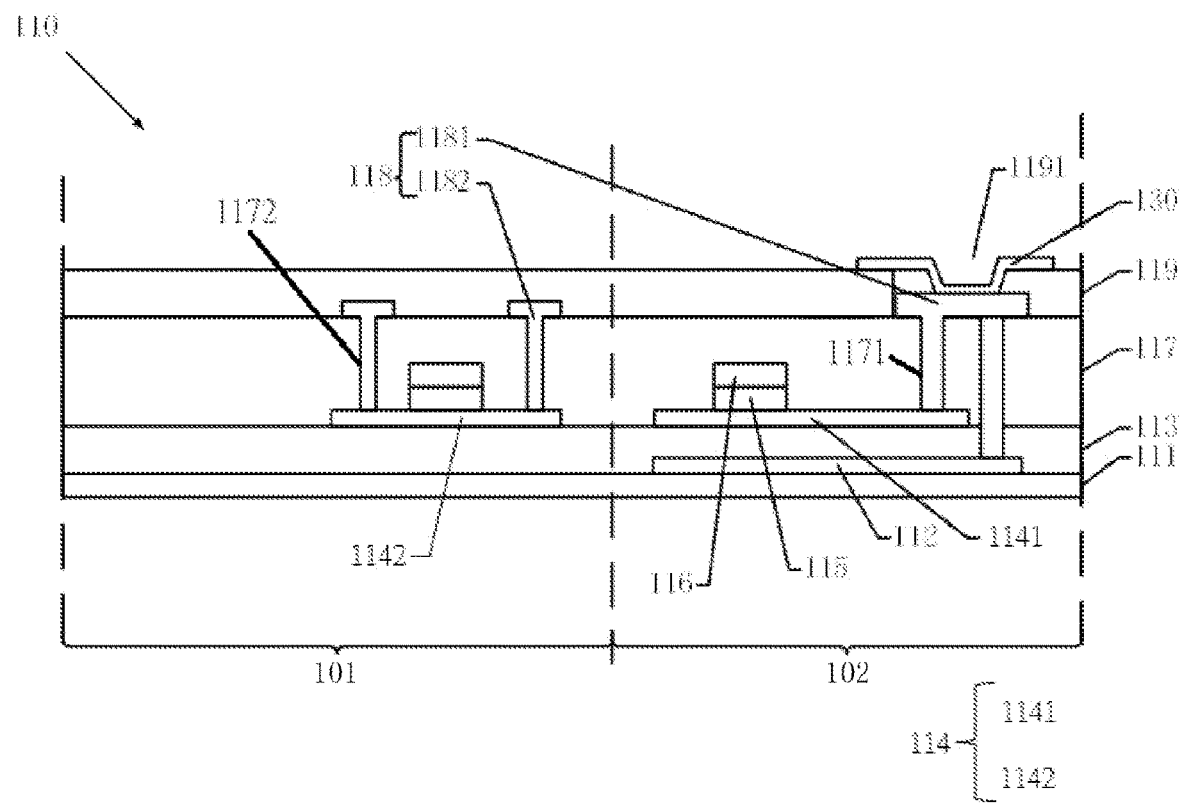
FIG. 1 is a schematic diagram of a first substrate in an embodiment.

Figure numerals: display panel 10, light-emitting region 101, non-light-emitting region 102, first substrate 110, second substrate 120, base substrate 111, light-shielding metal layer 112, buffer layer 113, active layer 114, first insulating layer 115, first metal layer 116, second insulating layer 117, second metal layer 118, first metal segment 1181, second metal segment 1192, third insulating layer 119, first active layer 1141, second active layer 1142, through-hole 1191, first leading line 130, cover plate 121, first electrode 122, light-emitting layer 123, retaining wall structure 124, second electrode 126, second leading line 126, packaging layer 127.

DETAILED DESCRIPTION OF PREFERRED EMBODIMENTS

The technical solutions in the embodiments of the present disclosure will be clearly and completely described below in conjunction with accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

The following disclosure provides many different embodiments or examples for achieving different structures of the present disclosure. To simplify the present disclosure, components and settings of specific examples are described below. They are only examples and are not intended to limit the present disclosure. In addition, the present disclosure may repeat reference numbers and/or reference letters in different examples, this repetition is for the purpose of simplicity and clarity, and does not itself indicate the relationship between various embodiments and/or settings discussed. In addition, the present disclosure provides examples of various specific processes and materials, but those of ordinary skill in the art may be aware of the present disclosure of other processes and/or the use of other materials.

Embodiment 1

In the present embodiment, a display panel 10 of the present disclosure comprises a light-emitting region 101 and a non-light-emitting region 102 surrounding the light-emitting region 101.

The display panel 10 further comprises a first substrate 110 and a second substrate 120, which are opposite to each other.

As shown in FIG. 1, the first substrate 110 is an array substrate and comprises a base substrate 111, a light-shielding metal layer 112, a buffer layer 113, an active layer 114, a first insulating layer 115, a first metal layer 116, a second insulating layer 117, a second metal layer 118, and a third insulating layer 119.

The base substrate 111 is a glass substrate, and the glass is transparent glass, which has a certain carrying capacity and can support various functional layers on the array substrate. Meanwhile, it can also effectively prevent outside water vapor from entering the array substrate, causing loss of function of the array substrate, thereby affecting service life of the display panel 10.

The light-shielding metal layer 112 is disposed on the base substrate 111. Specifically, the light-shielding metal layer 112 is disposed in the non-light-emitting region 102, and is used to reflect light directed in a direction of the base substrate 111 to prevent light leakage from one side of the base substrate 111 of the first substrate 110, which causes display abnormality.

The active layer 114 is disposed on the buffer layer 113. Specifically, the active layer 114 comprises a first active layer 1141 and a second active layer 1142, wherein a position of the first active layer 1141 corresponds to the light-shielding metal layer 112. In order for the light-shielding metal layer 112 to achieve the best light-shielding effect, generally speaking, an area of the light-shielding metal layer 112 is greater than an area of the first active layer 1141, that is, a projection of the first active layer 1141 on the base substrate 111 completely falls within a projection of the light-shielding metal layer 112 on the base substrate 111. The second active layer 1142 is disposed in the light-emitting region 101 and is used to provide electrical signals required by the display panel 10 to emit light.

The first insulating layer 115 is disposed on the active layer 114. Specifically, the first insulating layer 115 is disposed on the first active layer 1141 and the second active layer 1142, and an orthographic projection of the first insulating layer 115 completely falls within a region of the first active layer 1141 and the second active layer 1142.

The first metal layer 116 is disposed on the first insulating layer 115. The first insulating layer 115 is used to prevent the first metal layer 116 and the active layer 114 from directly contacting each other, causing short-circuiting.

The second insulating layer 117 is disposed on the buffer layer 113 and covers the active layer 114, the first insulating layer 115, and the first metal layer 116 to prevent external water vapor from entering and improve service life of the first substrate 110.

The second metal layer 118 is disposed on the second insulating layer 117. Specifically, the second metal layer comprises a first metal segment 1181 and a second metal segment 1182, the first metal segment 1181 is correspondingly disposed on the first active layer 1141 in the non-light-emitting region 102, the first metal segment 1181 comprises at least two pins. One of the pins is connected to the first active layer 1141 through the second insulating layer 117, and another pin is connected to the corresponding light-shielding metal layer 112 through the second insulating layer 117 and the buffer layer 113.

The second metal segment 1182 is correspondingly disposed on the second active layer 1142 in the light-emitting region 101. The second metal segment 1182 comprises at least two pins, the least two pins are connected to the second active layer 1142 through the second insulating layer 117 to form a source/drain electrode circuit.

The second metal layer 118 is disposed on the second insulating layer 117, wherein the first metal segment 1181 of the second metal layer 118 disposed in the non-light-emitting region 102 is connected to the first active layer 1141 and the light-shielding metal layer 112 through at least two connecting holes 1171 in the non-light-emitting region 102, and the second metal segment 1182 of the second metal layer 118 disposed in the light-emitting region 101 is connected to the second active layer 1142 through at least two connecting holes 1172 in the light-emitting region 101.

The third insulating layer 119 is disposed on the second insulating layer 117 and covers the second metal layer 118 to prevent intrusion of external water vapor from causing the second metal layer 118 to fail due to water vapor corrosion. Meanwhile, the third insulating layer 119 covering the second metal layer 118 also prevents short-circuiting caused by contact between the second metal layer 118 and other metal layers.

A via hole 1191 is defined in the third insulating layer 119 corresponding to the second metal layer 118, a portion of the second metal layer 118 is exposed outside of from the through-hole 1191, and a first leading line 130 is disposed in the via hole 1191, wherein the first leading line 130 is disposed on the inner surface of the via hole 1191 and is connected to the exposed second metal layer 118.

Figure 2:
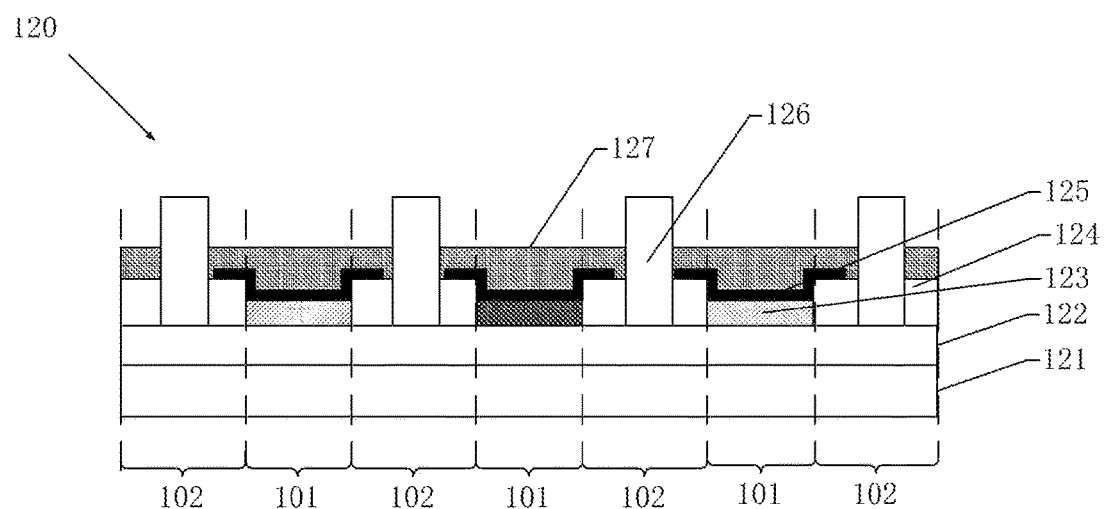
FIG. 2 is a schematic diagram of a second substrate in the embodiment.

As shown in FIG. 2, the second substrate 120 comprises a cover plate 121, a first electrode 122, a light-emitting layer 123, a retaining wall structure 124, a second electrode 125, a second leading line 126, and a packaging layer 127.

The cover plate 121 is a glass substrate, and the glass is transparent glass, which has a certain carrying capacity and can support various functional layers on the array substrate. Meanwhile, it can also effectively prevent outside water vapor from entering the array substrate, and affecting service life of the display panel 10.

The first electrode 122 is an anode, and the first electrode 122 is directly disposed on the cover plate 121. Since the cover plate 121 is a flat and smooth plate-structure, the anode may have a higher integrity and improve the uniformity of film thickness, thereby improving luminescent efficiency and service life of the display panel 10.

The retaining wall structure 124 is disposed on the first electrode 122 and corresponds to the non-light-emitting region 102. Specifically, the retaining wall structure 124 comprises a plurality of retaining wall units, and an interval surrounded by adjacent retaining wall units is the light-emitting region 101, and the light-emitting layer 123 is disposed in the interval. The light-emitting layer 123 comprises a plurality of light-emitting units, and colors of the light-emitting units are red, blue, and green. Each of the light-emitting units is correspondingly disposed in the interval surrounded by the retaining wall units, and the colors of adjacent light-emitting units are different, which ensures that the display panel 10 can display a colored image.

The second electrode 125 is a cathode, which is disposed on the light-emitting layer 123 and extends to an adjacent retaining wall unit. The first electrode 122 and the second electrode 125 have a voltage difference, so that the light emitting layer 123 can emit light, and the display panel 10 can normally display.

The second lead-out line 126 is disposed on the first electrode 122 and corresponds to the non-light-emitting region 102. Specifically, the second leading line 126 is a circular frustum or a prismatic frustum, and one terminal thereof penetrates through the retaining wall structure 124 from the first electrode 122. In order to prevent the second electrode 125 and the first electrode 122 disposed on the retaining wall structure 124 from being connected through the second leading line 126 and causing short-circuiting, an interval is defined between the second electrode 125 and the second leading line 126 which are disposed on a surface of the retaining wall structure 124.

The packaging layer 127 is disposed on the first electrode 122 and covers the retaining wall structure 124, the light-emitting layer 123, and the second electrode 125 to prevent the second electrode 125 and the first electrode 122 from being corroded by external water vapor, affecting service life. A portion of the packaging layer 127 covers the second lead-through 126 to facilitate subsequent connection of the second lead-through 126 to the first lead-through 130.

Figure 3:
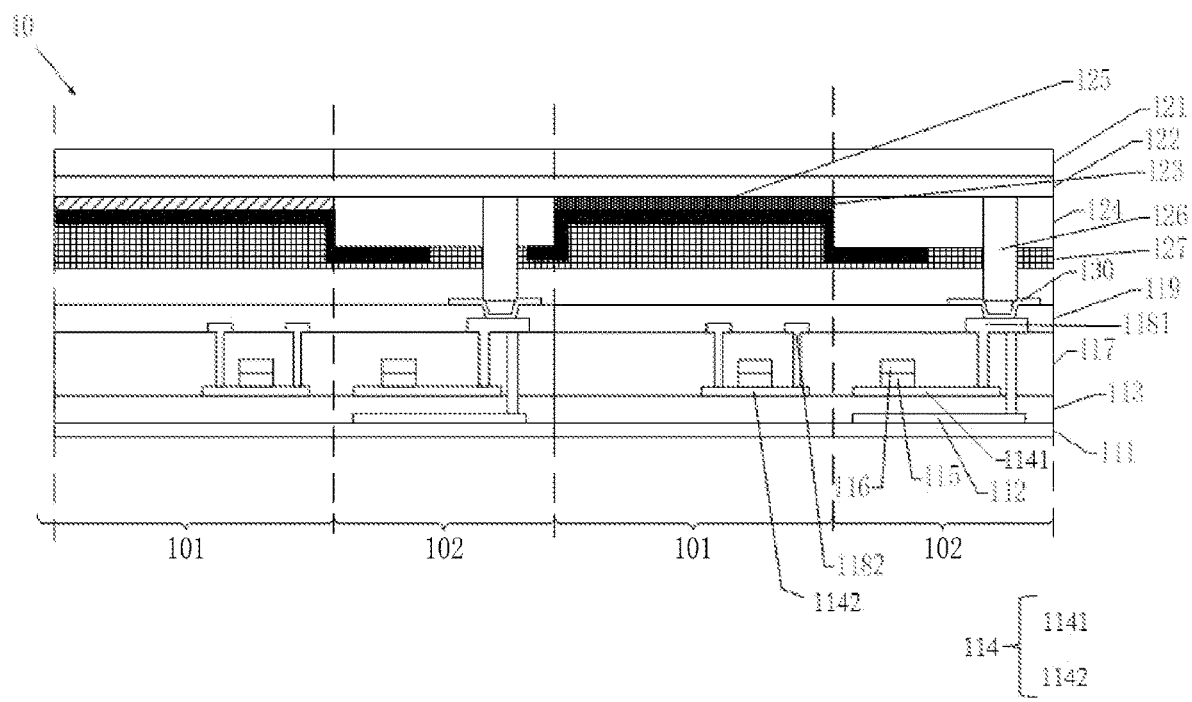
FIG. 3 is a schematic diagram of a third substrate in the embodiment.
Figure 4:
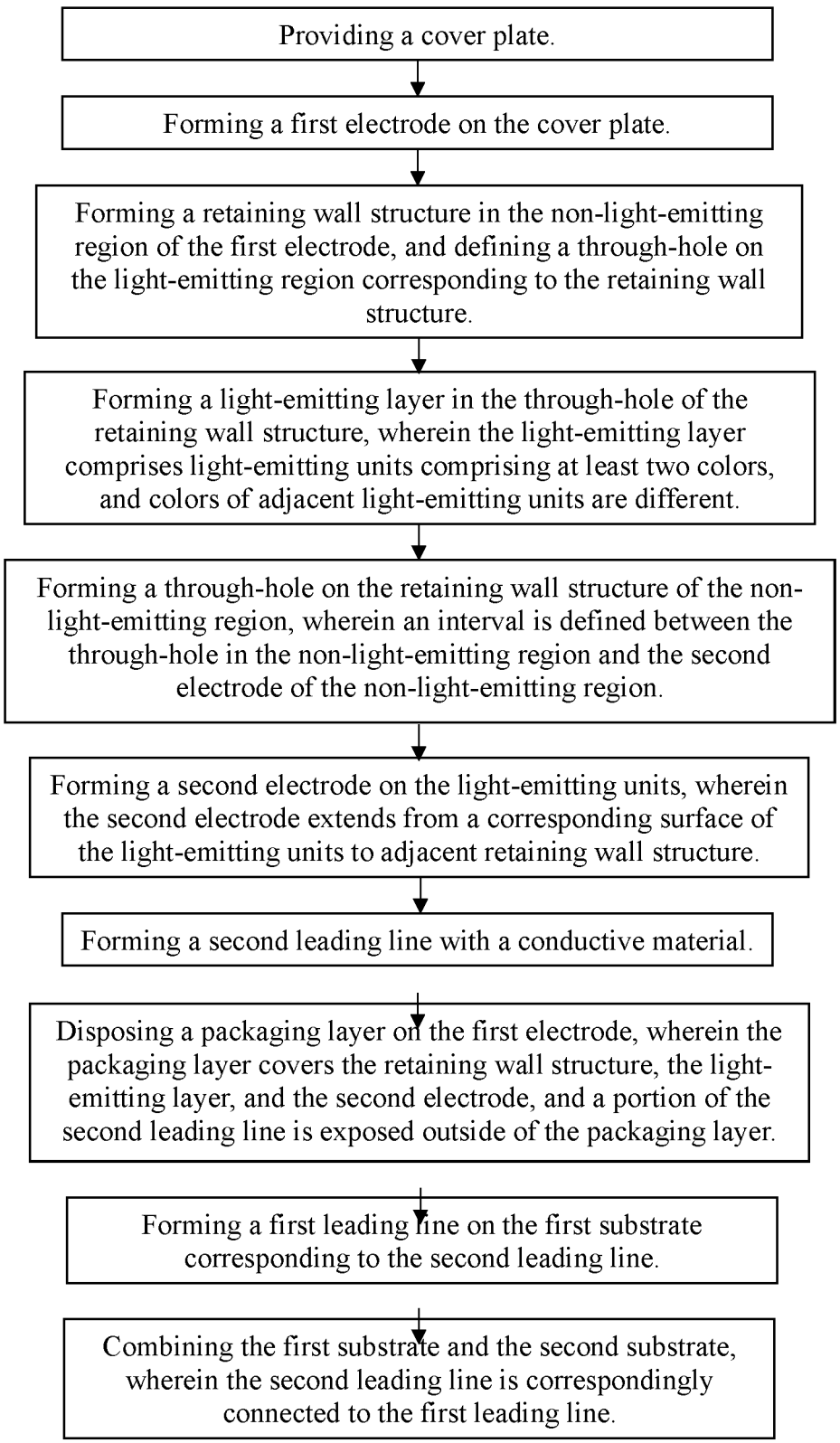
FIG. 4 is a schematic flowchart showing a manufacturing method of a display panel.
Figure 5:
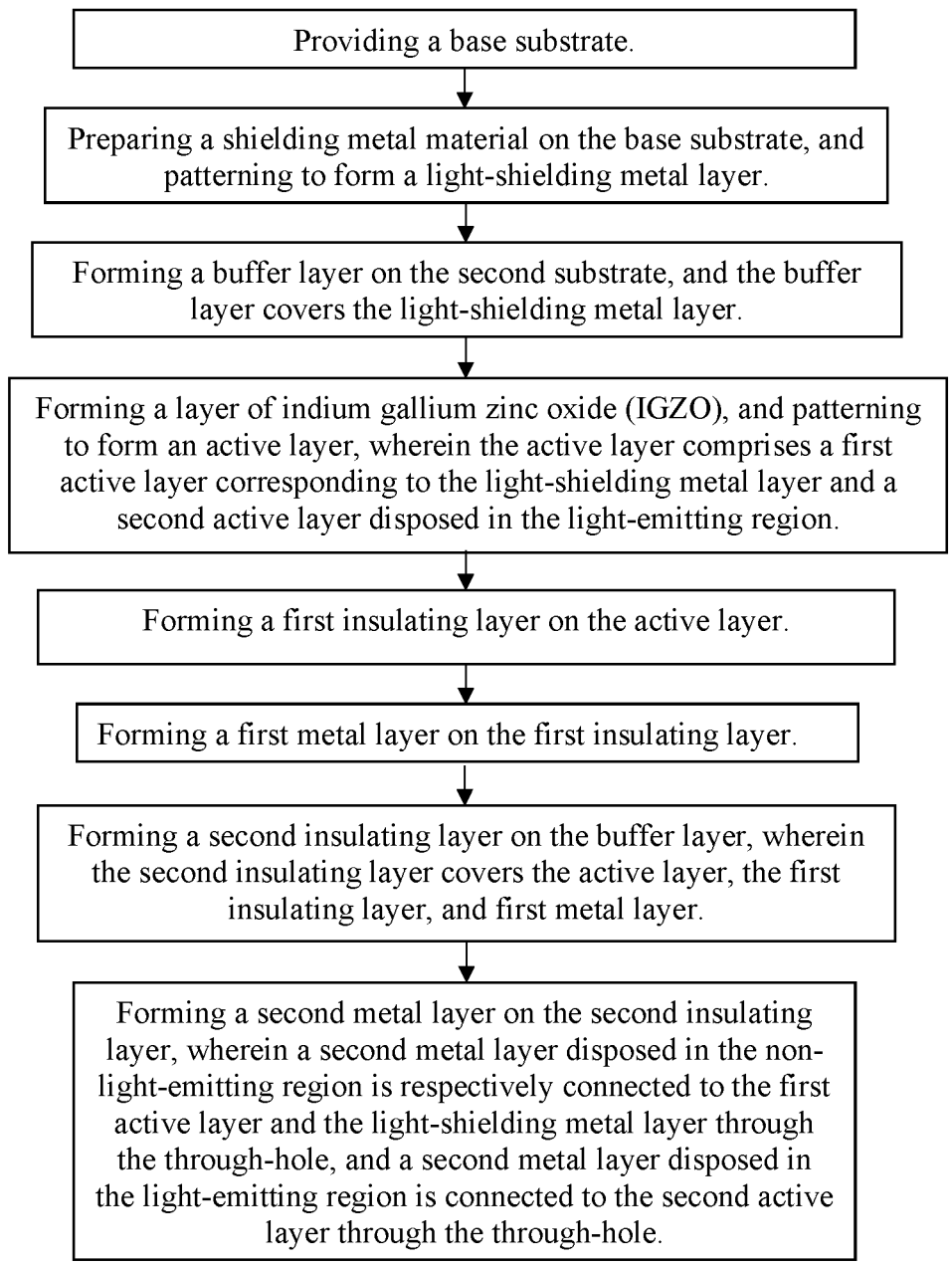
FIG. 5 is a schematic flowchart showing a manufacturing method of a first substrate.

As shown in FIG. 3, the first substrate 110 and the second substrate 120 are oppositely arranged to form the display panel 10, and the first leading line 130 is correspondingly connected to the second leading line 126, that is, the second metal layer is connected to the first electrode 122 through the first leading line 130 and the second leading line 126.

In order to better describe the present disclosure, an embodiment further provides a manufacturing method of the display panel, comprising forming a first substrate and a second substrate, and specific steps are as follows:

The method of forming the second substrate is as follows: providing a cover plate; forming a first electrode on the cover plate; forming a retaining wall structure in the non-light-emitting region of the first electrode, and defining a through-hole on the light-emitting region corresponding to the retaining wall structure; forming a light-emitting layer in the through-hole of the retaining wall structure, wherein the light-emitting layer comprises light-emitting units comprising at least two colors, and the colors of adjacent light-emitting units are different; forming a second electrode on the light-emitting units, wherein the second electrode extends from a corresponding surface of the light-emitting units to the adjacent retaining wall structure; forming a penetrating hole in the retaining wall structure of the non-light-emitting region, wherein an interval is defined between the penetrating hole and the second electrode of the non-light-emitting region; filling a conductive material in the penetrating hole to form a second leading line; forming a packaging layer above the first electrode, wherein the packaging layer covers the retaining wall structure, the light-emitting layer, and the second electrode, and a portion of the second leading line is exposed outside of the packaging layer; forming a first leading line on the first substrate corresponding to the second leading line; and combining the first substrate and the second substrate, wherein the second leading line is correspondingly connected to the first leading line.

The method of forming the first substrate is as follows: providing a base substrate; preparing a shielding metal material on the base substrate, and patterning to form a light-shielding metal layer; forming a buffer layer on the second substrate, and the buffer layer covers the light-shielding metal layer; forming a layer of indium gallium zinc oxide (IGZO), and patterning to form an active layer, wherein the active layer comprises a first active layer corresponding to the light-shielding metal layer and a second active layer disposed in the light-emitting region; forming a first insulating layer on the active layer; forming a first metal layer on the first insulating layer; forming a second insulating layer on the buffer layer, wherein the second insulating layer covers the active layer, the first insulating layer, and first metal layer; and forming a second metal layer on the second insulating layer, wherein the second metal layer disposed in the non-light-emitting region is connected to the first active layer and the light-shielding metal layer through the connecting holes, and the second metal layer disposed in the light-emitting region is connected to the second active layer through the connecting holes; combining the first substrate and the second substrate, wherein the second leading line is connected to the first leading line.

The above embodiments are only preferred embodiments of the present disclosure and are not intended to limit the present disclosure, and any modification, equivalent replacement, and improvement made within the spirit and principle of the present disclosure shall be included in the protection scope of the present disclosure.

What is claimed is:

1. A display panel, comprising a light-emitting region and a non-light-emitting region surrounding the light-emitting region;
    a first substrate, wherein a first leading line is disposed on one side of the first substrate; and
    a second substrate connected to the side of the first substrate comprising the leading line;
    wherein the second substrate comprises a cover plate;
    a first electrode disposed on one side of the cover plate in a direction of the first substrate, and extending from the non-light-emitting region to the light-emitting region;
    a retaining wall structure disposed on the first electrode, wherein the retaining wall structure comprises a plurality of through-holes and a plurality of retaining walls surrounding the through-holes, and the retaining walls are disposed in the non-light-emitting region;
    a light-emitting layer comprising a plurality of light-emitting units, wherein any one of the light-emitting units is correspondingly disposed in the through-holes of the retaining wall structure;
    a second electrode disposed on the light-emitting layer and extending to cover a portion of the retaining wall structure adjacent to the second electrode;
    a packaging layer disposed on the first electrode and covering the retaining wall structure, the light-emitting layer, and the second electrode; and
    a second leading line disposed on the first electrode of the non-light-emitting region, wherein the second leading line penetrates through the retaining wall structure and the packaging layer;
    wherein the first substrate comprises:
    a base substrate;
    a light-shielding metal layer disposed in the non-light-emitting region on the base substrate;
    a buffer layer disposed on the second substrate and covering the light-shielding metal layer;
    an active layer disposed on the buffer layer;
    a first insulating layer disposed on the active layer, wherein an orthographic projection of the first insulating layer on the base substrate completely falls within an orthographic projection of the active layer on the base substrate;
    a first metal layer disposed on the first insulating layer; and
    a second insulating layer disposed on the buffer layer and covering the active layer, the first insulating layer, and the first metal layer;
    wherein the active layer comprises:
    a first active layer disposed in the non-light-emitting region and corresponding to the light-shielding metal layer;
    a second active layer disposed in the light-emitting region;
    a second metal layer disposed on the second insulating layer and comprising a first metal segment disposed in the non-light-emitting region and corresponding to the first active layer, wherein the first metal segment comprises at least two pins, one of the pins penetrates through the second insulating layer to connect to the first active layer, and another pin penetrates through the second insulating layer and the buffer layer to connect to the light-shielding metal layer; and
    a third insulating layer disposed on the second insulating layer and covering the second metal layer, wherein a via hole is defined in the third insulating layer corresponding to the first metal segment, the first leading line is disposed on an inner surface of the via hole and covers a region where the first metal segment is exposed from the via hole, and the first leading line is connected to the first metal segment.

2. The display panel as claimed in claim 1, wherein the second electrode extends from a surface of the corresponding light-emitting unit to the retaining wall structure of the non-light-emitting region, and an interval is defined between the second electrode and the second leading line which are disposed on the retaining wall structure.

3. The display panel as claimed in claim 1, wherein the first leading line corresponds to the second leading line disposed in the non-light-emitting region.

4. The display panel as claimed in claim 1, wherein a material of the first leading line comprises at least one of indium zinc oxide, indium tin oxide, aluminum, or silver.

\* \* \* \* \*